(12) United States Patent
Annamalai et al.

(10) Patent No.: US 8,901,019 B2
(45) Date of Patent: Dec. 2, 2014

(54) VERY LOW CTE SLOPE DOPED SILICA-TITANIA GLASS

(71) Applicant: Corning Incorporated, Corning, NY (US)

(72) Inventors: Seshian Annamalai, Painted Post, NY (US); Carlos Alberto Duran, Ottawa (CA); Kenneth Edward Hrdina, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/835,039

(22) Filed: Mar. 15, 2013

(65) Prior Publication Data

US 2014/0155246 A1 Jun. 5, 2014

Related U.S. Application Data

(60) Provisional application No. 61/731,621, filed on Nov. 30, 2012.

(51) Int. Cl.
*G03F 1/22* (2012.01)
*C03C 3/06* (2006.01)
*C03C 4/00* (2006.01)
*C03B 19/14* (2006.01)
*C03B 19/12* (2006.01)

(52) U.S. Cl.
CPC ... *G03F 1/22* (2013.01); *C03C 3/06* (2013.01); *C03C 4/0085* (2013.01); *C03B 19/1461* (2013.01); *C03B 19/12* (2013.01); *C03C 2201/12* (2013.01); *C03C 2201/23* (2013.01); *C03C 2201/32* (2013.01); *C03C 2201/42* (2013.01); *C03C 2203/44* (2013.01); *C03C 2203/54* (2013.01); *C03B 2201/075* (2013.01); *C03B 2201/12* (2013.01); *C03B 2201/20* (2013.01); *C03B 2201/23* (2013.01); *C03B 2201/32* (2013.01); *C03B 2201/40* (2013.01); *C03B 2201/42* (2013.01)
USPC .......................................................... 501/54

(58) Field of Classification Search
CPC ............ C03C 2201/06; C03C 2201/11; C03C 2201/12; C03C 2201/40; C03C 2201/32; C03C 3/06
USPC .......................................................... 501/54
See application file for complete search history.

(56) References Cited

U.S. PATENT DOCUMENTS 7,429,546 B2 9/2008 Iwahashi et al.
7,538,052 B2 5/2009 Iwahashi et al.

(Continued)

FOREIGN PATENT DOCUMENTS

WO 2009116690 9/2009
WO 2011/078414 6/2011

*Primary Examiner* — Noah Wiese
(74) *Attorney, Agent, or Firm* — Kevin L. Bray; Walter M. Douglas (57) ABSTRACT

The present disclosure is directed to a doped silica-titania glass, DST glass, consisting essentially of 0.1 wt. % to 5 wt. % halogen, 50 ppm-wt. to 6 wt. % one or more oxides of Al, Ta and Nb, 3 wt. % to 10 wt. % $TiO_2$ and the remainder $SiO_2$. In an embodiment the halogen content can be in the range of 0.2 wt. % to 3 wt. % along with 50 ppm-wt. to 6 wt. % one or more oxides of Al, Ta and Nb, 3 wt. % to 10 wt. % $TiO_2$ and the remainder $SiO_2$. In an embodiment the DST glass has an OH concentration of less than 100 ppm. In another embodiment the OH concentration is less than 50 ppm. The DST glass has a fictive temperature $T_f$ of less than 875° C. In an embodiment $T_f$ is less than 825° C. In another embodiment $T_f$ is less than 775° C.

28 Claims, 3 Drawing Sheets

(56) References Cited

U.S. PATENT DOCUMENTS

| | | |
|---|---|---|
| 7,935,648 B2 * | 5/2011 | Maida et al. ............... 501/54 |
| 7,989,378 B2 | 8/2011 | Koike et al. |
| 7,998,892 B2 | 8/2011 | Koike et al. |
| 8,012,653 B2 | 9/2011 | Koike et al. |
| 8,329,604 B2 | 12/2012 | Iwahashi et al. |
| 2004/0250573 A1 | 12/2004 | Hack et al. |
| 2005/0153824 A1 | 7/2005 | Alkemper et al. |
| 2006/0179879 A1 * | 8/2006 | Ellison et al. ............... 65/17.4 |
| 2008/0004169 A1 * | 1/2008 | Ellison ............... 501/54 |
| 2009/0143213 A1 | 6/2009 | Hrdina et al. |
| 2010/0179047 A1 | 7/2010 | Koike et al. |
| 2010/0261597 A1 | 10/2010 | Koike et al. |
| 2010/0323873 A1 | 12/2010 | Koike et al. |
| 2011/0034787 A1 | 2/2011 | Hagino et al. |
| 2011/0048075 A1 | 3/2011 | Duran et al. |
| 2011/0207592 A1 | 8/2011 | Duran et al. |
| 2011/0207593 A1 | 8/2011 | Duran et al. |
| 2012/0121857 A1 | 5/2012 | Koike et al. |
| 2012/0264584 A1 | 10/2012 | Miyasaka et al. |
| 2013/0047669 A1 | 2/2013 | Annamalai |
| 2013/0052391 A1 | 2/2013 | Annamalai |

\* cited by examiner

VERY LOW CTE SLOPE DOPED SILICA-TITANIA GLASS

This application claims the benefit of priority under 35 U.S.C. §119 of U.S. Provisional Application Ser. No. 61/731,621 filed on Nov. 30, 2012 the content of which is relied upon and incorporated herein by reference in its entirety.

FIELD

This disclosure is directed to a silica-titania glass doped with halogens and metal oxides having a very low CTE slope and a method for making such glass.

BACKGROUND

Extreme Ultra-Violet Lithography (EUVL) is the emerging/leading lithography technology for the 22 nm node and beyond for manufacturing MPU/DRAMs [MPU—Micro Processing Unit, and DRAM—Dynamic Random Access Memory). The EUVL scanners which are used to produce these Integrated Chips are presently being produced in small numbers to demonstrate this new technology. Optics, particularly reflective optics, are an important part of these scanners. Low thermal expansion glass, for example ULE® glass (Corning Incorporated) is currently being used for making the projection optics systems. The major advantages of a low thermal expansion glass such as ULE® Glass are polishability to the required finish, its CTE (coefficient of thermal expansion or expansivity) control, and its dimensional stability. As the development of EUVL systems proceeds the specifications are becoming more stringent for the newer optics systems. As a result, the specifications for the materials used in the optics systems are required to meet tighter and tighter requirements. The present disclosure is directed to a material that can meet these tighter requirements. In particular, the material disclosed herein has an expansivity slope, that is significantly improved over that of the materials presently available.

SUMMARY

The present disclosure is directed to a doped silica-titania glass D-SiO$_2$—TiO$_2$, herein also called DST glass, having an expansivity (or CTE) slope that is significantly improved over the expansivity slope of the presently available binary silica-titania glass SiO$_2$—TiO$_2$ with the dopants being halogens and one or more oxides of Al, Nb and Ta. When using the DST glass disclosed herein the improvement in the glass' expansivity slope exceeds the improvements that are possible by adjustment of the annealing cycle alone and/or allows for the same improvement in expansivity slope to be obtained via faster annealing cycles which greatly reduces costs. This is accomplished via a combination of both structural and compositional changes.

Compositionally, the DST glass has a halogen, for example fluorine, F, and one or more of the oxides of Al, Ta and Nb, added to a titania doped silica glass system. In one embodiment the DST glass contains 0.1 wt. % to 5 wt. % fluorine, 50 ppm-wt. to 6 wt. % of oxides of Al, Ta and Nb, 3 wt. % to 10 wt. % TiO$_2$ and the remainder SiO$_2$. In another embodiment the DST glass contains 0.2 wt. % to 3 wt. % F, 50 ppm-wt. to 6 wt. % of oxides of Al, Ta and Nb, 3 wt. % to 10 wt. % TiO$_2$ and the remainder SiO$_2$. In an additional embodiment the DST glass contains 1 wt. % to 2 wt. % F, 50 ppm-wt. to 6 wt. % of oxides of Al, Ta and Nb, 5 wt. % to 8 wt. % TiO$_2$ and the remainder SiO$_2$. Further, in one embodiment the OH concentration in the DST glass is less than 100 ppm. In another embodiment the OH concentration is less than 50 ppm. In a further embodiment the OH concentration is less than 30 ppm. In an additional embodiment the OH concentration is less than 20 ppm.

Structurally, the annealing cycle is controlled to yield the desired glass structure(s). It has been found that while annealing alone can provide a structural improvement leading to an expansivity slope reduction of up to 40% for a silica-titania glass that does not contain fluorine, the addition of dopants, in an amount in the range disclosed herein, provides for structural improvements that can lead to a CTE slope reduction in excess of 70%.

In one aspect the DST glass of this disclosure has an expansivity slope at 20° C. of less than 1 ppb/K$^2$. In an embodiment the DST glass' expansivity slope at 20° C. is less than 0.8 ppb/K$^2$. In another embodiment the DST glass' expansivity slope at 20° C. is less than 0.6 ppb/K$^2$.

Additionally, the annealing cycle is controlled in such a manner that it would yield the desired homogeneity of the fictive temperature of the DST glass. This aspect is particularly important due to the presence of the dopants whose concentration distribution could be non-uniform. The halogens, especially, affect the fictive temperature significantly and any non-uniformity in their distribution could cause large variations in properties and render the glass useless.

In one aspect the DST glass has a fictive temperature, $T_f$, of less than 875° C. In an embodiment the DST glass has a fictive temperature of less than 825° C. In another embodiment the DST glass has a fictive temperature of less than 775° C.

This DST glass disclosed herein is not process limited. That is, the DST glass can be made by different manufacturing processes, for example, sol-gel, soot blank, soot pressing, overhead vapor deposition, the direct process, the indirect process, plasma process and other processes known in the art.

The DST glass has two crossover temperatures, Tzc (temperature at which the CTE of the glass is zero, also called herein a Tzc point) within the normal operational range for the glass when used in lithographic processes, including processes using the 13.5 nm wavelength radiation. In one embodiment the two $T_{zc}$'s are in the range of 0° C. to 150° C. In another embodiment the two $T_{zc}$'s are in the range of 20° C. to 100° C. In a further embodiment the two Tzc values are in the range of 20° C. to 80° C. In an embodiment the two $T_{zc}$s are in the range of 10° C. to 60° C. or even 10 to 40° C. In an additional embodiment the DST glass has a crossover temperature (Tzc) in the range of 0° C. to 100° C. in combination with an expansivity slope which substantially equals zero within this temperature range.

In an embodiment the DST glass has a strain point of less than 900° C. In another embodiment the strain point is less than 850° C. In a further embodiment the strain point is less than 810° C. The DST glass has a viscosity that is significantly reduced over that of the ordinary binary silica-titania glass SiO$_2$—TiO$_2$. For example, the ordinary binary silica-titania glass, has a Anneal Point of 1001° C. and Strain Point of 892° C., whereas the DST glass has Anneal Point and Strain Point of 885° C. and 770° C.

A Homogeneity of $T_f$ and Also a Homogeneity in CTE.

In one embodiment the $T_f$ varies less than ±10° C. within an entire part. In another embodiment the $T_f$ variation is less than ±5° C. within an entire part. In a further embodiment the $T_f$ variation is less than ±2° C. within an entire part. In one embodiment the Tzc variation is less than ±5° C. within an entire part. In another embodiment the Tzc variation is less than ±3° C. within an entire part. In an additional embodiment the Tzc variation is less than ±2° C. within an entire part. The variation in these average values in the entire part satisfy the above limits. It should be noted that this requires both good control of composition as well as tight control of the annealing process. Both will be needed to be within the scope of this invention.

In one embodiment an article or part made of the DST glass has an MSFR (Mid Spatial Frequency Roughness) of less than 0.2 nm. In another embodiment the MSFR is less than 0.15 nm. In a further embodiment the MSFR is than 0.12 nm rms.

In on an embodiment the peak CTE within the two crossover temperatures does not exceed 30 ppb/K and has a slope of zero ppb/K$^2$ within the two cross over temperatures. In another embodiment peak CTE within the two crossover temperatures do not exceed 20 ppb/K. In a further embodiment the peak CTE within two crossover temperatures is less than 15 ppb/K. In an additional embodiment the peak CTE within the two crossover temperatures is less than 10 ppb/K.

The DST glass of this disclosure can be used to make photo mask blanks or as projection optics mirror substrates. The DST glass can also be used to make smaller blanks which can then be used to form the critical zone of a mirror blank of a projection optics system in a EUVL stepper. Halogen doping can be achieved during consolidation of a regular titania-silica OVD blank. Alternatively shapes made by either soot-pressing or sol-gel method can be doped with the halogen while consolidating them.

DETAILED DESCRIPTION

Herein the base glass is a silica-titania glass. When a dopant is added to the base glass to make a low expansion glass according to this disclosure the composition of the resulting glass is given as wt. % or ppm-wt. of the added dopant, wt. % $TiO_2$ and the remainder being wt. % $SiO_2$.

The expansivity of a material over a given temperature range, $\Delta CTE$, is the difference between the maximum CTE, ($CTE_{max}$) and the minimum CTE ($CTE_{min}$) over the temperature range and can be determined using the equation:

$$\Delta CTE=CTE_{max}-CTE_{min} \quad \text{Eq. 1}$$

For EUV lithography it is critical that the expansivity of lithographic elements be as close to zero as possible over the widest possible operational temperature range. A zero expansivity means that the material neither expands not contracts. FIG. 6 is Curve 52 of FIG. 5 with $CTE_{max}$ and $CTE_{min}$ indicated. $CTE_{max}$ is 3.8 ppb/K and $CTE_{min}$ is −2 ppb/K. Using Eq.1:

$$\Delta CTE=3.8 \text{ ppb/k}-(-2 \text{ ppb/K})=5.8 \text{ ppb/K}$$

The value of $\Delta CTE$ for the various curves presented in Figures has been calculated and is presented in Tables 2B and 3B.

Silica-titania glass with reduced expansivity is an important requirement for the projection optics mirror blanks as well as photomask blanks for EUVL steppers. The DST glass described herein has a reduced CTE slope (the slope is a measurement of the instantaneous change in CTE (ppb/K) versus temperature (in K)) which will allow EUVL stepper makers to use higher source power because of the materials described herein offering improved thermal/dimensional stability. The DST glass described herein will also enable EUVL users to achieve much higher resolution. Further, the DST glass described herein can be used in small quantities for the critical zone of projection optics mirror which will help lower the cost of large projection optics mirrors which can have a diameter in the range of 10 cm to 60 cm. The use of inserts in the critical zone of EUVL systems elements is disclosed in commonly owned U.S. patent application Ser. Nos. 13/563,882 and 13/564,215.

The tuning of a silica-titania glass and/or a doped glass for optimal performance in a specified application depends in the details of the operating conditions in which the glass will be used. The combination of adjustments in $TiO_2$ concentration and the fictive temperature $T_f$ enables the adjustment of crossover points Tzc1 and Tzc2, and also the expansivity maximum to optimize performance in each application. Without doping, Tzc1 can be adjusted by manipulation of $TiO_2$ concentration alone. Slow annealing can be used to lower the expansivity slope and bring Tzc2 lower. However, an extremely low expansivity of +/−3 ppb/K over a range of tens of degrees Celsius (° C.) can only be obtained at temperatures in the neighborhood of the expansivity maximum, and thus such desirable regime can only be obtained in the undoped-standard annealed glass at temperatures starting at ~150° C. The use of doping to the silica-titania glass as described herein significantly enlarges the adjustment range of $T_{zc}$, thus enabling an extremely low expansivity range to exist at temperatures starting at around room temperature. This situation is particularly beneficial for the application of the glass as a substrate for EUV masks and optics, whose temperature range of operation starts at room temperature. Since different components in an EUV system are exposed to different temperature variations, and as EUV system design and operation regimes depend on the evolution of developments in other areas such as system NA (numerical aperture), resist speed and source light intensity, no single combination of glass composition and Tf is ideal for all situations. Manipulation of $T_{zc}$, over a wide temperature range thus enables tuning of the material to the specific requirements in each case.

This disclosure describes a doped titania-silica glass containing up to 5 wt. % halogens and 50 ppm-wt. to 6 wt. % one or more oxides of Al, Ta and Nb. The halogen doping was done during the consolidation step of the glass process. Halogen doping during the consolidation enables the making of an initial oxide doped soot blank by different methods, for example:

(1) The OVD (overhead vapor deposition) process in which a soot blank is made in a burner by the combustion of a silica precursor, a titania precursor and the oxide dopant precursor(s) and the soot is collected on a mandrel, treated with a halogen containing gas for example, when the halogen of choice is fluorine, like $SiF_4$ and consolidated, and collected to form a DST glass.

(2) Soot pressing of pre-made doped titania-silica soot containing, for example, a soot made by the combustion of a silica precursor and a titania precursor in a burner. The soot, which is a particulate is collected in a vessel; and during and/or after collection or the soot, the soot is treated with a halogen while pressing the soot at consolidation temperatures to form a DST glass. The silica-titania glass can also be further doped during preparation of the soot by the addition of an additional oxide dopant precursor(s), for example an Al, Ta or Nb precursor.

(3) A sol-gel process in which silica-titania soot is made and formed into a shape using the sol-gel process and dried to form porous silica-titania articles that are then treated with a halogen containing gas during consolidation. In an embodiment additional oxide dopants precursors are added to the sol-gel before it is formed into a shape, dried and treated with halogen during consolidation. Consolidation may be carried out in air or an air-inert gas mixture. In another embodiment the soot used in the sol-gel process is one in which the additional oxide precursors were added during the formation of the silica-titania soot as described above in Item (2).

There are other methods known in the art that can be used to make the silica-titania soot which can then be treated with a halogen containing gas during consolidation. While it is possible to make a silica-titania soot and immediately consolidate it in a halogen-containing atmosphere to form a DST glass, this method is not favored because of environmental and possible health hazards; for example, an expensive scrubber system would be required to prevent halogens such as chlorine and fluorine from escaping into the atmosphere and harming persons working nearby.

When the halogen used is fluorine, the fluorine containing gas can be $F_2$, $CF_4$, $SF_4$, $SiF_4$ or other volatile fluorine compounds mixed with a carrier gas, for example air. When compounds such as $CF_4$ and $SF_4$ are used as the fluorinating agent oxygen is present in the carrier gas in order to convert the non-fluorine portion of the fluorinating agent (C, Si or S) to a volatile species, for example $CO_2$, $SiO$ or $SO_2$, which is swept out of the system by the carrier gas. The carrier gas can also be an inert gas, for example nitrogen, helium or argon, However, when these are used as the carrier gas for $CF_4$, $SiF_4$ and $SF_4$ oxygen should be present as indicated above. Halogens, in addition to doping the glass, can dehydrate the glass. That is, the halogen will reduce the number of hydroxyl groups, OH, that may be present in the glass. Dehydration can also be done using a mixture of chlorine and fluorine, or sequentially by first dehydrating using chlorine and then using a fluorine containing species such as those described above to fluorine dope the glass.

The consolidation temperature will depend on the method of soot blank preparation and can vary from 1300° C. for a OVD process to 1670° C. for other processes such as soot pressing and sol-gel. Following consolidation, the DST glass was annealed by heating to a temperature in the range of 1000° C. to 1100° C. for a time in the range of 0.5 hour to 2 hours. In one embodiment the annealing temperature was 1050° C. and the holding time at the annealing temperature was 1 hour. At the end of the holding time the glass was cooled from the annealing temperature, for example 1050° C., to 700° C. at the rate of 3° C. per hour, and then cooled from 700° C. to room temperature naturally; natural cooling being to turn off the heat source and allowing the glass to cool to room temperature at the cooling rate of the furnace.

Samples were then made from the prepared DST glass and their expansivity was measured by the sandwich seal method, described in U.S. Patent Application Publication No. 2011/0043787 (now U.S. Pat. No. 8,328,417), in a temperature range of 150° K to 425° K. A reduction in expansivity of about 70% was achieved over a reference sample of ULE® glass (Corning code 7973) whose expansivity slope is 1.60 $ppb/K^2$ at 20° C. The data suggests that the improved expansivity slope is largely dictated by reduced fictive temperatures for the DST glasses. It was also noted that the reference ULE® glass sample exhibited a similar reduction in $T_f$ as a result of a slow annealing process. The improvements observed can be expected to continue as $T_f$ is reduced via either increased halogen levels and or combined with slower annealing cycles. The data indicate that halogens enable a significant viscosity reduction and consequently reduction of $T_f$ is possible without a large change in the actual absolute CTE. In the following Example 1, the target halogen content of the glass is 1.5 wt. % F and Example 2, 0.8 wt. % F. Annealing cycles and there the effect of fictive temperature have been described and discussed U.S. Patent Application Publication Nos. 2011/0048075 (now U.S. Pat. No. 8,763,429), 2011/0207593 and 2011/0207592.

Example 1

Titania doped silica soot particles were made by flame hydrolysis using $TiCl_4$ and $SiCl_4$, and the soot was deposited on a bait rod in a lathe using the OVD process for more than 10 hours. The resulting soot blank was then consolidated in a muffle furnace as follows:
heating the soot blank to more than 1200° C. in a flowing He atmosphere,
sintering and consolidating the blank at a peak temperature of more than 1250° C., with flowing He, $O_2$ and selected fluorine containing gas for a target F concentration of 1.5 wt. % in the consolidated glass.

The resulting blank was bluish gray in color due to the presence of $TiO_2$ crystallites. Discs of 15 mm diameter were cut from the consolidated blank and were heated to a temperature of 1670° C. for 1 hour to dissolve the crystallites and obtain a clear glass. These discs were then annealed by heating them to 1050° C. for 1 hour followed by cooling to 700° C. at a rate of either (a) 3° C./h or (b) 30° C./h to achieve two different fictive temperatures. The fictive temperature of samples (a) and (b) were 772° C. and 785° C., respectively. These samples were then polished and assembled in to sandwich seals with a ULE® glass (Corning Code 7973) as the central piece between two experimental samples of the same composition and $T_f$. The sandwich seal samples are approximately of the size 1.5"×1"×⅛" (38 mm×25.4 mm×3.2 mm). Stress on the center piece (meat of the sandwich) exerted by the two experimental DST pieces (the bread pieces of the sandwich) was measured as the sandwich is heated from −100° C. to +125° C., from which the difference in the CTE slope between the experimental material and the Code 7973 ULE glass, whose CTE slope is known, is extracted. The samples with a $T_f$ of 772° C. has a CTE slope of less than 0.7 $ppb/K^2$ and the samples with a $T_f$ of 785° C. had an average CTE slope of less than 0.8 $ppb/K^2$ at 20° C. Code 7973 glass has a CTE slope of 1.60 $ppb/K^2$.

Example 2

Titania doped silica soot particles were made by flame hydrolysis of $TiCl_4$ and $SiCl_4$ and the soot was deposited on a bait rod in a lathe using the OVD process for about 16.5 hours. The soot blank thus made was 5992 g in mass with a density of 0.42 g/cc and a diameter of 135.7 mm. The soot blank was then consolidated in a muffle furnace as follows:

heating the soot blank to more than 1200° C. in a flowing He atmosphere, sintering and consolidating the blank at a peak temperature of more than 1250° C., with flowing He, $O_2$ and selected fluorine containing gas for a target F concentration of 0.8 wt. % in the consolidated glass.

The resulting blank was bluish gray in color due to the presence of $TiO_2$ crystallites. Discs 15 mm in diameter were cut from the consolidated blank and were heated to 1670° C. for 1 hour to dissolve the crystallites and obtain a clear glass. These discs were then annealed by heating them to 1050° C. for 1 hour followed by cooling to 700° C. at either (a) 3° C./hour (slow anneal cycle) or (b) 30° C./hour (fast anneal cycle) rate to achieve two different fictive temperatures which were 870° C. and 918° C., respectively. These samples were then polished and assembled in to sandwich seals with a regular ULE® glass (7973) as the central piece between two experimental samples of the same composition and $T_f$. The sandwich seal samples are approximately of the size 1.5"× 1"×⅛" (38 mm×25.4 mm×3.2 mm). Stress on the center piece (the meat of the sandwich) exerted by the two experimental pieces (the bread pieces of the sandwich) was measured as the sandwich is heated from −100° C. to +125° C. from which the difference in the CTE slope between the experimental material and the Code 7973 ULE glass, whose CTE slope is known, is extracted. The samples with a $T_f$ of 870° C. has a CTE slope of less than 1.2 ppb/$K^2$ at 20° C. and the samples with a $T_f$ of 918° C. had an average CTE slope of less than 1.5 ppb/$K^2$ at 20° C.

Figure 1:
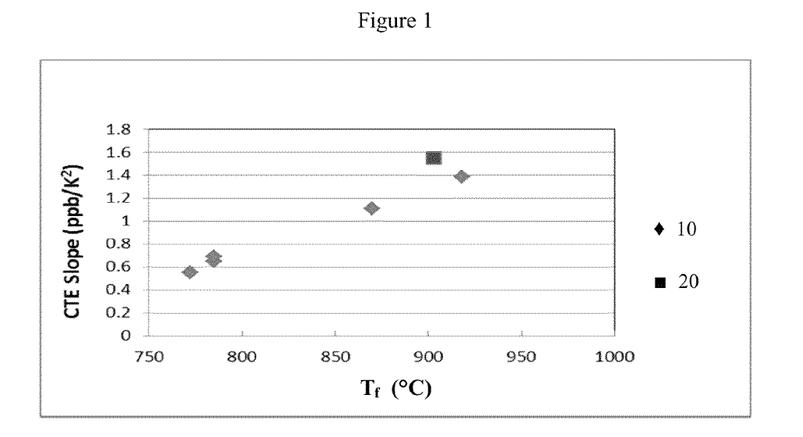
FIG. 1 is a graph of CTE vs. $T_f$ illustrating the effect of F-dopant addition (in this example the halogen is fluorine, wt. %), represented by diamonds 10, on the CTE slope of a silica-titania glass. Silica-titania glass without the added dopant is represented by the square 20.

FIG. 1 illustrates the effect of fluorine addition to a silica-titania glass on the CTE slope of the resulting DST glass as compared to the CTE slope of a binary silica-titania glass without added fluorine. The DST glass is represented by diamonds 10 and the binary silica-titania glass without fluorine is represented by square 20. The fluorine addition decreases the viscosity of the glass and thereby decreases the fictive temperature of the glass. Fictive temperature reduction is the prime driver for CTE slope reduction in silica-titania glass. However, while it has been found that fluorine addition does reduce the CTE slope, that reduction is greater than that which would be expected from the fictive temperature reduction alone.

Figure 2:
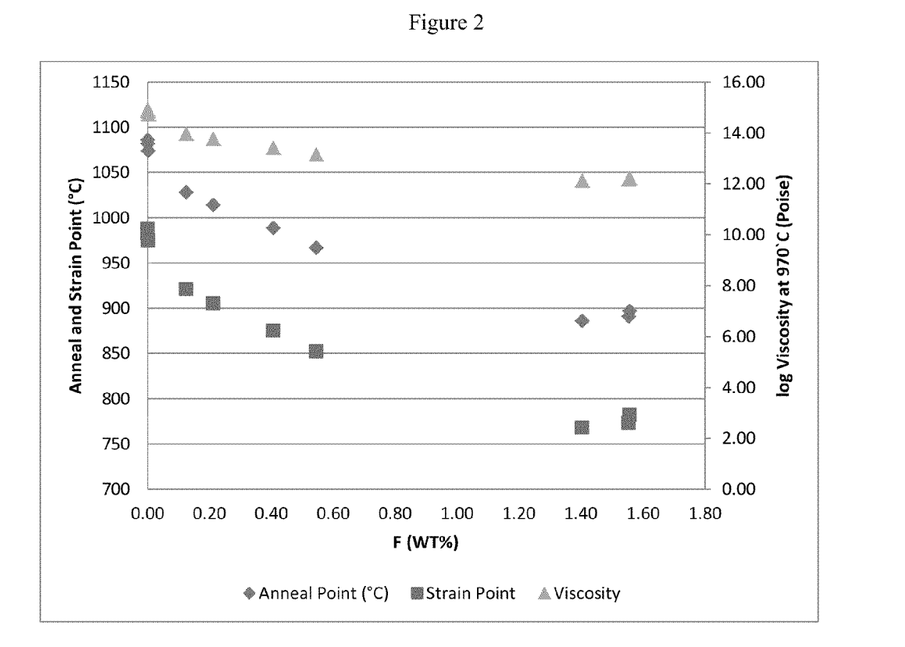
FIG. 2 is a graph of the Anneal and Strain Points (left vertical axis) and the Log of the Viscosity (right vertical axis) versus dopant addition (in this example the halogen is fluorine, wt. %) for silica-titania glasses containing 0 wt. % up to 1.6 wt. % dopants.

FIG. 2 is a graph illustrating the effect of fluorine addition on the Anneal and Strain Points (left vertical axis) and the Viscosity (right vertical axis) of silica-titania glasses containing from 0 wt. % F up to 1.6 wt. % F. The graph shows the anneal and strains points decreasing at substantially the same rate as the fluorine content increases, and that the viscosity of the glass is also reduced with increasing fluorine content.

Figure 3:
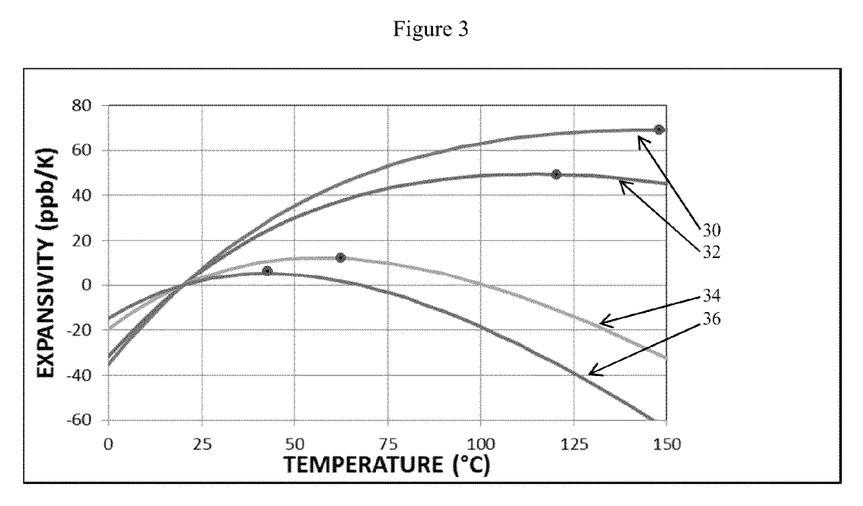
FIG. 3 is a graph of expansivity versus temperature for (a) a silica-titania glass without dopants and (b) a doped silica-titania glass after a fast annealing cycle and a slow annealing cycle as described herein.

FIG. 3 is a graph of expansivity versus temperature for (1) silica-titania glass without fluorine and (2) a fluorine doped silica-titania glass after a fast annealing cycle and a slow annealing cycle as described herein. All the glasses in FIG. 3 have the same first crossover temperature Tzc1 of 20° C. which is accomplished by adjusting the wt. % $TiO_2$ in the glass. The F content in the DST glasses is 1.5 wt. % as indicated in Table 1. The FIG. 3 shows the behavior of each glass after undergoing two different annealing cycles a fast annealing cycle in which the cooling rate is 30° C./hour and a slow annealing cycle in which the cooling rate is 3° C./hour. $TiO_2$ and F values are in wt. % ΔCTE is in ppb/K over the temperature range 0° C. to 150° C.

TABLE 1

| FIG. 3 Numeral | Glass/anneal cycle | $TiO_2$ (Wt. %) | F (Wt. %) |
| --- | --- | --- | --- |
| 30 | ULE, fast anneal | 7.4 | 0 |
| 32 | ULE, slow anneal | 7.4 | 0 |
| 34 | DST, fast anneal | 7.5 | 1.5 |
| 36 | DST, slow anneal | 7.5 | 1.5 |

The numeral 30 curve, which represents ULE glass after the fast anneal, has a maximum expansivity (black dot ●) of ~70 ppb/K, a first crossover temperature Tzc1 at 20° C. and a second zero crossover temperature Tzc2 at T>300° C. The numeral 32 curve, which represents a ULE glass after the slow anneal, has a maximum expansivity (black dot ●) of ~50 ppb/K, a first crossover temperature Tzc1 of 20° C. and second crossover temperature Tzc2 of approximately 230° C. The second crossover temperature Tzc2 for the glasses of curves 30 and 32 is off the scale to the right in FIG. 3. The numeral 34 curve, which represents the DST glass after annealing at 30° C./hour, has maximum expansivity (black dot ●) of approximately 12 ppb/K and a first crossover temperature Tzc1 of 20° C. and a second crossover temperature Tzc2 of approximately 100° C. The numeral 36 curve, which represents the DST glass after the slow anneal, has a maximum expansivity (black dot ●) of approximately 6 ppb/K, a first crossover temperature Tzc1 of 20° C. and second crossover temperature of approximately 65° C.

Figure 4:
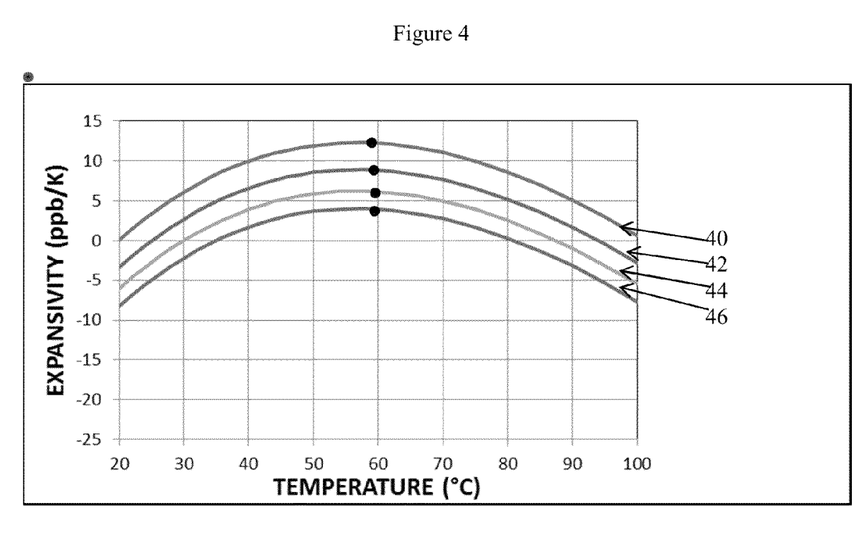
FIG. 4 is a graph of expansivity versus temperature illustrating the expansivity behavior between 20° C. and 100° C. for different doped $SiO_2$—$TiO_2$ glasses which differ only in $TiO_2$ concentration in order to yield different values of Tzc1.

FIG. 4 is a graph of expansivity versus temperature illustrating the expansivity behavior between 20° C. and 100° C. of four different doped $SiO_2$—$TiO_2$ glasses which differ only in $TiO_2$ concentration in order to yield different values of Tzc1. The titania value for each curve is given in Table 2A. The halogen content in each sample is 1.5 wt. % and all four samples have been annealed to the same $T_f$ of approximately 780° C. using the fast anneal cycle. Table 2B gives the ΔCTE value for all for curves over two temperature ranges. Within the temperature range of 20-100° C. shown in the graph, the glass 44 with Tzc1 of 30° C. has a ΔCTE of 11 and provides a Tzc2 of ~87° C.

TABLE 2A

| FIG. 4 Numeral | $TiO_2$ (Wt. %) | F (Wt. %) | Tzc1 (° C.) | Tzc2 (° C.) |
| --- | --- | --- | --- | --- |
| 40 | 8.4 | 1.5 | 20 | ~105 |
| 42 | 8.5 | 1.5 | 25 | ~94 |
| 44 | 8.6 | 1.5 | 30 | ~87 |
| 46 | 8.7 | 1.5 | 35 | 80 |

TABLE 2B

| FIG. 4 | ΔCTE, T = 20-100° C. | | | ΔCTE, T = 30-80 | | |
| --- | --- | --- | --- | --- | --- | --- |
| Numeral | ΔCTE | $CTE_{max}$ | $CTE_{min}$ | ΔCTE | $CTE_{max}$ | $CTE_{min}$ |
| 40 | 12.5 | 12.5 | 0 | 6.5 | 12.5 | 6 |
| 42 | 12 | 8.5 | −3.5 | 6 | 8.5 | 2.5 |
| 44 | 11 | 5.5 | −5.5 | 6 | 6 | 0 |
| 46 | 11.5 | 4 | −7.5 | 8 | 4 | −2 |

All CTE values are in ppb/K

Figure 5:
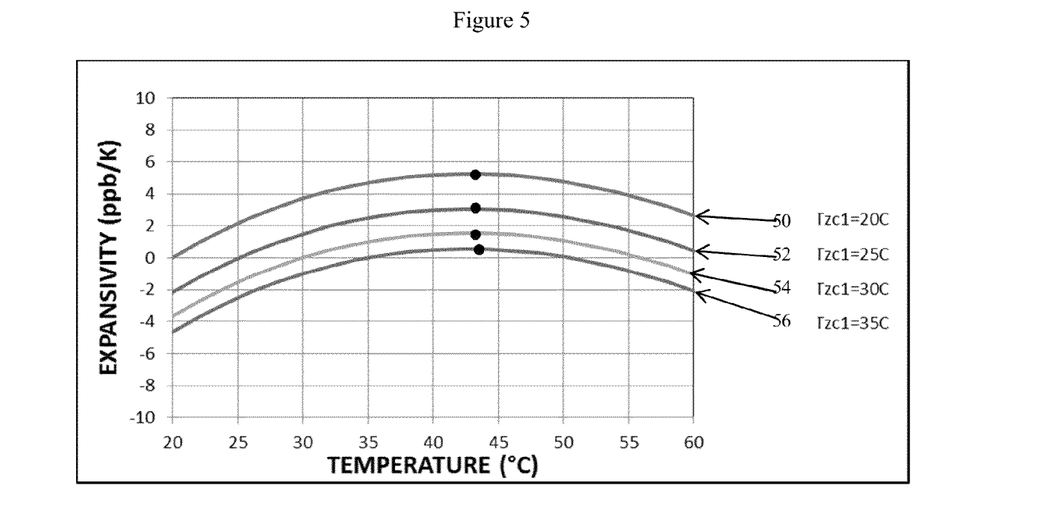
FIG. 5 is a graph of expansivity versus temperature for doped silica-titania glasses that differ only in titania content, each glass having been annealed to have the same fictive temperature $T_f$ of 730° C.
Figure 6:
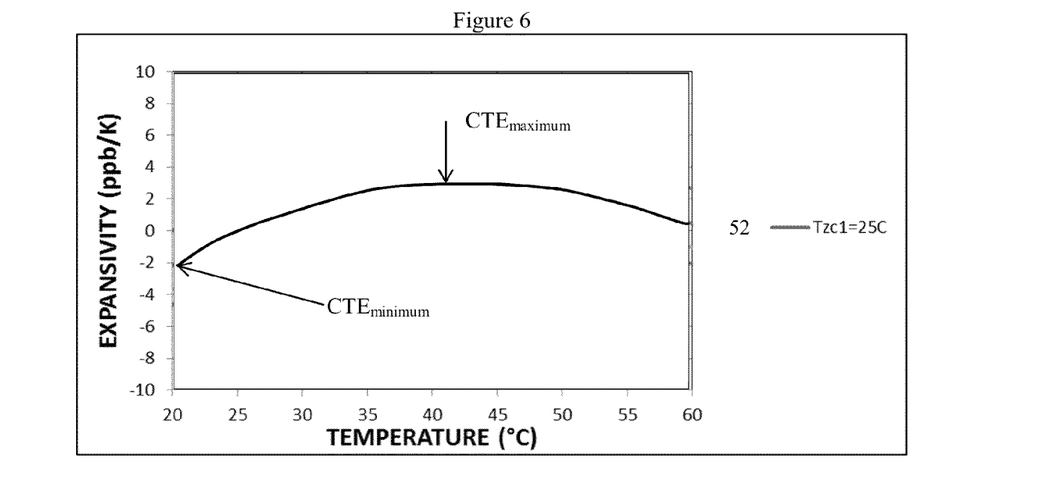
FIG. 6 is a graph of FIG. 5 curve 52 that is used to illustrate the calculation of expansivity over a selected temperature range using Eq. 1, $\Delta CTE=CTE_{max}-CTE_{min}$.

FIG. 5 is a graph of expansivity versus temperature in the range of 20° C. to 60° C. for four different doped silica-titania glass that differ only in titania content. The halogen content of each glass is 1.5 wt. % and each glass has been annealed using the slow anneal cycle to have the same fictive temperature $T_f$ of 730° C. Optimal glass

TABLE 3A

| FIG. 5 Numeral | TiO₂ (Wt. %) | Tzc1 (° C.) | Tzc2 (° C.) |
|---|---|---|---|
| 50 | ~8.8 | 20 | ~70 |
| 52 | ~8.9 | 25 | ~62 |
| 54 | ~9.0 | 30 | 55 |
| 56 | ~9.1 | 35 | 50 |

TABLE 3B

| FIG. 5 | ΔCTE, T = 20-60° C. | | | ΔCTE, T = 25-50° C. | | |
|---|---|---|---|---|---|---|
| Numeral | ΔCTE | $CTE_{max}$ | $CTE_{min}$ | ΔCTE | $CTE_{max}$ | $CTE_{min}$ |
| 50 | 5.4 | 5.4 | 0 | 3.4 | 5.4 | 2 |
| 52 | 5.8 | 3.8 | −2 | 3.8 | 3.8 | 0 |
| 54 | 4.3 | 0.8 | −3.5 | 2.6 | 0.8 | −1.8 |
| 56 | 4.7 | .2 | −4.5 | 2.5 | .2 | −2.3 |

All CTE values are in ppb/K properties are obtained by slowly annealing the glass to a lower $T_f$ of approximately 730° C. using a slow anneal process, thus bringing Tzc2 within the temperature range of interest, that is a Tzc2 of less than or substantially equal to 60° C. In this particular case, optimum properties would be obtained with a glass having a TiO₂ concentration such as to bring Tzc1 to ~26° C. and Tzc2 to ~58° C. Based on the data that has been obtained, the TiO₂ concentration would be 8.9 to 9.0 wt. %. Table 3B gives the ΔCTE value for all for curves over two temperature ranges.

The glass made according to the present disclosure can be used to make photo mask blanks or as projection optics mirror substrates; and it can also be used to make smaller blanks which can then be used to form the critical zone of a mirror blank of a projection optics system in a EUVL stepper. Halogen doping can be achieved during consolidation of a regular titania-silica OVD blank. Alternatively doped silica-titania glass and glass shapes can be made using either soot-pressing or sol-gel methods in which halogen doping us carried out during a drying, heating or consolidation step.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A doped silica-titania glass with an expansivity slope of less than 1 ppb/K² at 20° C., said doped silica titania glass comprising SiO₂, 3 wt. % to 10 wt. % TiO₂, and a dopant selected from the group consisting of 0.1 wt. % to 5 wt. % halogens and 50 ppm-wt. to 6 wt. % oxides of at least one of Al, Nb and Ta.

2. The doped silica-titania glass according to claim 1, wherein said glass has a fictive temperature of less than 875° C.

3. The doped silica-titania glass according to claim 1, wherein said glass has a fictive temperature of less than 825° C.

4. The doped silica-titania glass according to claim 1, wherein said glass has a fictive temperature of less than 775° C.

5. The doped silica-titania glass according to claim 1, wherein said glass has a fictive temperature variation of less than ±10° C.

6. The doped silica-titania glass according to claim 1, wherein said glass has a fictive temperature variation of less than ±5° C.

7. The doped silica-titania glass according to claim 1, wherein said glass has a fictive temperature variation of less than ±2° C.

8. The doped silica-titania glass according to claim 1, wherein said glass has an expansivity slope at 20° C. of less than 0.6 ppb/K².

9. The doped silica-titania glass according to claim 1, wherein said dopant is 0.1 wt. % fluorine to 5 wt. % fluorine.

10. The doped silica-titania glass according to claim 1, wherein said glass comprises 0.2 wt. % to 3 wt. % fluorine, 3 wt. % to 10 wt. % TiO₂ and SiO₂, and has an expansivity slope at 20° C. of less than 0.8 ppb/K².

11. The doped silica-titania glass according to claim 1, wherein said dopant is 1 wt. % F to 3 wt. % F.

12. The doped silica-titania glass according to claim 1, wherein said glass further comprises OH, said OH concentration of less than 100 ppm.

13. The doped silica-titania glass according to claim 12, wherein said glass has an OH concentration of less than 50 ppm.

14. The doped silica-titania glass according to claim 12, wherein said glass has an OH concentration of less than 30 ppm.

15. The doped silica-titania glass according to claim 12, wherein said glass has an OH concentration of less than 20 ppm.

16. The doped silica-titania glass according to claim 1, wherein said glass has a MSFR (Mid Spatial Frequency Roughness) less than 0.2 nm rms.

17. The doped silica-titania glass according to claim 1, wherein said glass has a ΔCTE of 12 ppb/K or in the temperature range of 20-100° C.

18. The doped silica-titania glass according to claim 1, wherein said glass has a ΔCTE of less than 5 ppb/K in the temperature range of 20-100° C.

19. A doped silica-titania glass having a ΔCTE of 5.5 ppb/K or less in the temperature range of 20° C. to 75° C. and two $T_{zc}$ points in the temperature range of 20° C. to 75° C., said glass comprising SiO₂, 3 wt. % to 10 wt. % TiO₂ and a dopant selected from the group consisting of 0.1 wt. % to 5 wt. % fluorine and 50 ppm-wt. to 6 wt. % oxides of one or more of Al, Nb and Ta.

20. The glass according to claim 19, wherein said glass has a peak expansivity is less than 4 ppb/K in the temperature range of 25° C. to 65° C. and two $T_{zc}$ points in the temperature range of 25° C. to 65° C.

21. The glass according to claim 19, wherein said glass has a peak expansivity less than 2 ppb/K in the temperature range of 27° C. to 60° C. and two $T_{zc}$ points in the temperature range of 27° C. to 60° C.

22. The glass according to claim 19, wherein said glass has a peak expansivity less than 1 ppb/K in the temperature range of 32° C. to 55° C. and two $T_{zc}$ points in the temperature range of 32° C. to 55° C.

23. The doped silica-titania glass according to claim 19, wherein said dopant is 0.2 wt. % to 3 wt. % fluorine.

24. A method for making a doped silica-titania glass, the method comprising:
   preparing oxide doped silica-titania soot particles by flame hydrolysis and or flame combustion using a silica-precursor, a titania precursor and precursors for oxide dopants;
   depositing the soot particles on a bait rod in a lathe using the OVD process to prepare a soot blank; and consolidating the resulting soot blank in a furnace as follows:

heating the soot blank to more than 1200° C. in a flowing He atmosphere, sintering and consolidating the blank at a peak temperature of more than 1250° C., with flowing He, $O_2$ and halogen containing gas for a halogen concentration of at least 1.5 wt. % in the consolidated glass.

25. The method according to claim 24, wherein said halogen containing gas is selected from the group consisting of $F_2$, $CF_4$, $SF_4$, $SiF_4$.

26. The doped silica-titania glass according to claim 1, wherein said glass consists essentially of $SiO_2$, 3 wt. % to 10 wt. % $TiO_2$, and a dopant selected from the group consisting of 0.1 wt. % to 5 wt. % halogens and 50 ppm-wt. to 6 wt. % oxides of at least one of Al, Nb and Ta.

27. The doped silica-titania glass according to claim 1, wherein said glass consists essentially of 0.2 wt. % to 3 wt. % fluorine, 3 wt. % to 10 wt. % $TiO_2$ and $SiO_2$, and has an expansivity slope at 20° C. of less than 0.8 ppb/$K^2$.

28. The doped silica-titania glass according to claim 1, wherein said glass has two $T_{zc}$ points in the temperature range of 20° C. to 75° C.

* * * * *

UNITED STATES PATENT AND TRADEMARK OFFICE
CERTIFICATE OF CORRECTION

PATENT NO.       : 8,901,019 B2  
APPLICATION NO.  : 13/835039  
DATED            : December 2, 2014  
INVENTOR(S)      : Sezhian Annamalai et al.

It is certified that error appears in the above-identified patent and that said Letters Patent is hereby corrected as shown below:

On the Title Page, Item (72), Inventors Seshian Annamalai – should read Sezhian Annamalai Signed and Sealed this  
Tenth Day of March, 2015

Michelle K. Lee  
*Deputy Director of the United States Patent and Trademark Office*